(12) United States Patent
Lee

(10) Patent No.: US 6,800,522 B2
(45) Date of Patent: Oct. 5, 2004

(54) METHOD FOR FABRICATING SEMICONDUCTOR DEVICE WITH STORAGE NODE CONTACT STRUCTURE

(75) Inventor: Sung-Kwon Lee, Ichon-shi (KR)

(73) Assignee: Hynix Semiconductor Inc., Kyougki-do (KR)

(*) Notice: Subject to any disclaimer, the term of this patent is extended or adjusted under 35 U.S.C. 154(b) by 0 days.

(21) Appl. No.: 10/609,614

(22) Filed: Jul. 1, 2003

(65) Prior Publication Data
US 2004/0126973 A1 Jul. 1, 2004

(30) Foreign Application Priority Data
Dec. 26, 2002 (KR) .................................... 10-2002-84293

(51) Int. Cl.[7] .......................................... H01L 21/8242
(52) U.S. Cl. ....................... 438/253; 438/254; 438/618; 438/622; 438/740
(58) Field of Search ................................ 438/253, 254, 438/395, 397, 618, 622, 740

(56) References Cited

U.S. PATENT DOCUMENTS 6,096,595 A * 8/2000 Huang ........................ 438/238
6,555,481 B2 * 4/2003 Nakamura ................... 438/734
2003/0082903 A1 * 5/2003 Yang et al. .................. 438/629

* cited by examiner

Primary Examiner—Hsien Ming Lee
(74) Attorney, Agent, or Firm—Jacobson Holman PLLC

(57) ABSTRACT

The present invention is related to a method for fabricating a semiconductor device capable of preventing a bit line pattern from being attacked during a storage node contact hole formation. The method includes the steps of: forming a bit line insulation layer on a substrate structure having a plurality of plugs; forming a group of trenches exposing a group of the plugs by etching the bit line insulation layer; burying each trench by a conductive material to form a bit line electrically connected to the exposed plug; isolating the bit line by performing a chemical mechanical polishing process until the bit line insulation layer is exposed; forming an inter-layer insulation layer on the above structure including the bit line; and etching selectively the inter-layer insulation layer and the bit line insulation layer to form storage node contact holes exposing another group of the plugs.

13 Claims, 5 Drawing Sheets

METHOD FOR FABRICATING SEMICONDUCTOR DEVICE WITH STORAGE NODE CONTACT STRUCTURE

FIELD OF THE INVENTION

The present invention relates to a method for fabricating a semiconductor device; and, more particularly, to a method for forming a bit line and a storage node contact through the use of a damascene process.

DESCRIPTION OF RELATED ARTS

Hereinafter, with reference to FIGS. 1A to 1D, there are provided descriptions on problems arose by a conventional method for forming a contact hole.

Referring to FIG. 1A, a first inter-layer insulation layer 13 is formed on a substrate 11 providing various elements for constructing a semiconductor device such as a word line (not shown), an impurity contact region 12 and so forth. The first inter-layer insulation layer 13 is also called as a word line insulation layer. The first inter-layer insulation layer 13 is selectively etched to form a contact hole exposing the impurity contact region 12.

Next, a plurality of plugs 14 for storage node contacts or bit line contacts are formed. The plug 14 is formed in the contact hole and is contacted to the exposed impurity contact region 12.

It is general to use polysilicon for the plug 14. However, instead of the polysilicon, a multi-layered structure stacked of a tungsten layer and a barrier metal layer including Ti/TiN typically used in a diffusion barrier layer is recently used for the plug 14.

After the plug 14 formation, a diffusion barrier layer 15 having the typical structure of Ti/TiN structure is formed on the plug 14 in order to prevent a source gas used in a deposition of a bit line metal layer 16 from reacting with the plug 14 and the impurity contact region 12. Then, on an upper surface of the diffusion barrier layer 15, the bit line metal layer 16 is formed by using such materials as polysilicon, tungsten and so forth or metal alloys such as tungsten nitride, tungsten silicide and so forth.

Next, a plasma enhanced chemical vapor deposition (PECVD) technique or a low pressure chemical vapor deposition (LPCVD) technique is performed to form a hard mask nitride layer 17. Herein, the hard mask nitride layer 17 is made of nitride-based materials including silicon oxynitride or silicon nitride.

As shown, it is also possible to additionally form a buffer layer using undoped silicate glass (USG) in order to reduce stress generated between the bit line metal layer 16 and the hard mask nitride layer 17.

Referring to FIG. 1B, the hard mask nitride layer 17, the bit line metal layer 16 and the diffusion barrier layer 15 are selectively etched through the use of a bit line etch mask to thereby form a bit line.

The high level of integration in a semiconductor device makes it difficult to stably secure a pattern formation process margin and overlay accuracy. Thus, a self-align contact (SAC) process is adopted to solve the above problems because it uses pre-deposited materials instead of an additional mask during an etch process for forming various patterns such as a contact hole pattern. As a result of this approach, the SAC process is capable of reducing costs for a semiconductor device fabrication process. Among various etch methods of the SAC process, a nitride layer is typically used as an etch stop layer.

Therefore, during the SAC process, an insulation layer is etched under conditions that the nitride layer encompasses an upper part and lateral walls of a conductive pattern such as a gate electrode or a bit line and an oxide layer is subsequently etched in a higher rate than the nitride layer.

Since the SAC process is applied to a storage node contact formation process, a nitride-based etch stop layer 18 is deposited on the above entire structure including the bit line in order to prevent a bit line loss during the SAC process. FIG. 1C is a cross-sectional view showing an etch profile of the etch stop layer 18 formed along an upper part and lateral walls of the bit line.

With reference to FIG. 1D, a second inter-layer insulation layer 19 is formed on top of the etch stop layer 18. The second inter-layer insulation layer is called bit line insulation layer. At this time, the bit line insulation layer 19 is commonly made of USG.

Next, under a target that the second inter-layer insulation layer 19 remains in a predetermined thickness on the etch stop layer 18, a chemical mechanical polishing process (CMP) is performed to planarize the second inter-layer insulation layer 19. After the CMP process, a photoresist pattern 20 for forming a storage node contact, and the second inter-layer insulation layer 19 and the etch stop layer 18 are sequentially etched by using the photoresist pattern 20 as an etch mask. This process is the SAC process. From this SAC process, a contact hole 21 exposing a surface of the plug 14 allocated between the bit lines is formed. As shown in FIG. 1D, the etch stop layer 18 is etched during the SAC process and remains as a spacer at lateral sides of the diffusion barrier layer 15, the bit line metal layer 16 and the hard mask nitride layer 17.

Prior to forming the contact hole 21, an additional process for forming a contact pad is generally performed to improve an overlap margin. However, descriptions on this additional process are omitted.

Meanwhile, because of the high integration of the semiconductor device, such a unit element as a word line, a bit line or so forth is arrayed vertically, and a contact pad is introduced. However, a width of the bottom structure gets narrower. As a result, an aspect ratio progressively increases. For instance, in case that the aspect ratio is above about 3, a gap-fill property is diminished. Particularly, a void is generated in the course of filling-up a space between the bit lines when the second inter-layer insulation layer 19 is deposited.

Accordingly, during the SAC process for forming the contact hole 21, the hard mask nitride layer 17 is attacked by this etching. This attacked portion is denoted as the reference numeral 22 in FIG. 1D. Also, there is a problem in an insulation property between the bit line metal layer 16 and a subsequent storage node. Furthermore, an overall electrical property is deteriorated.

SUMMARY OF THE INVENTION

It is, therefore, an object of the present invention to provide a method for fabricating a semiconductor device with use of damascene process in order to prevent a conductive pattern from being attacked during a storage node contact hole formation process.

In accordance with an aspect of the present invention, there is provided a method for fabricating a semiconductor device, including the steps of: forming a bit line insulation layer on a substrate structure having a plurality of plugs; forming a group of trenches exposing a group of the plugs by etching the bit line insulation layer; burying each trench by a conductive material to form a bit line electrically connected to the exposed plug; isolating the bit line by performing a chemical mechanical polishing process until the bit line insulation layer is exposed; forming an inter-layer insulation layer on the above structure including the bit line; and etching selectively the inter-layer insulation layer and the bit line insulation layer to form storage node contact holes exposing another group of the plugs.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, an inventive method for forming a storage node contact hole will be described in detail.

Figure 1A:
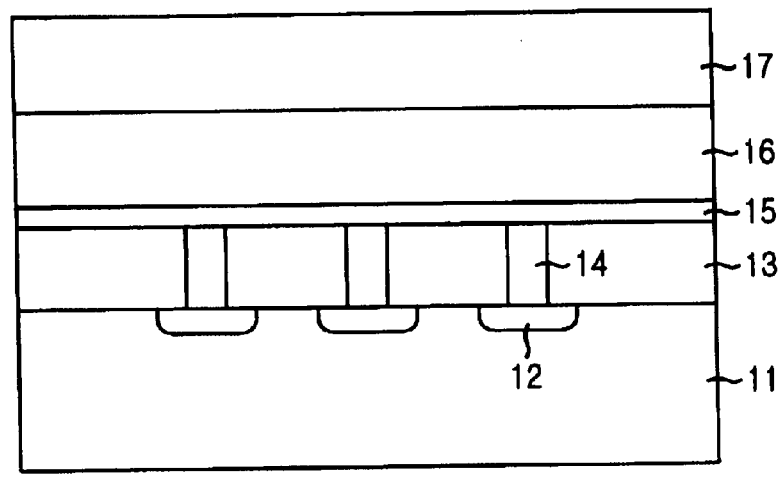
FIGS. 1A to 1D are cross-sectional views showing a conventional process for forming a storage node contact hole.
Figure 1B:
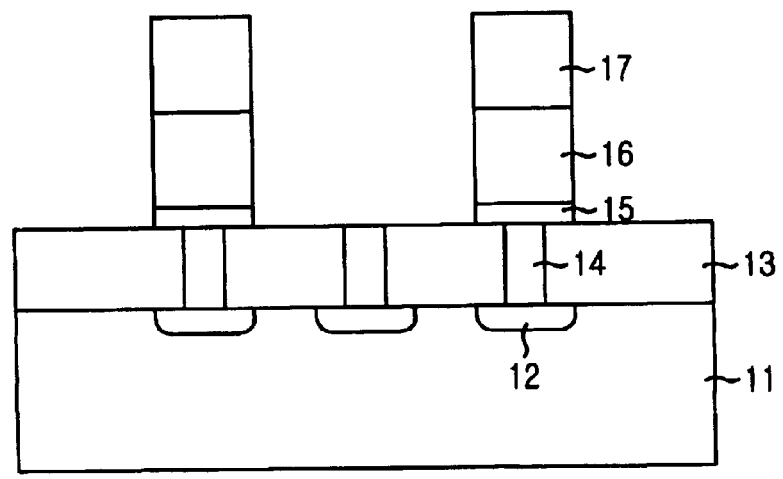
Figure 1C:
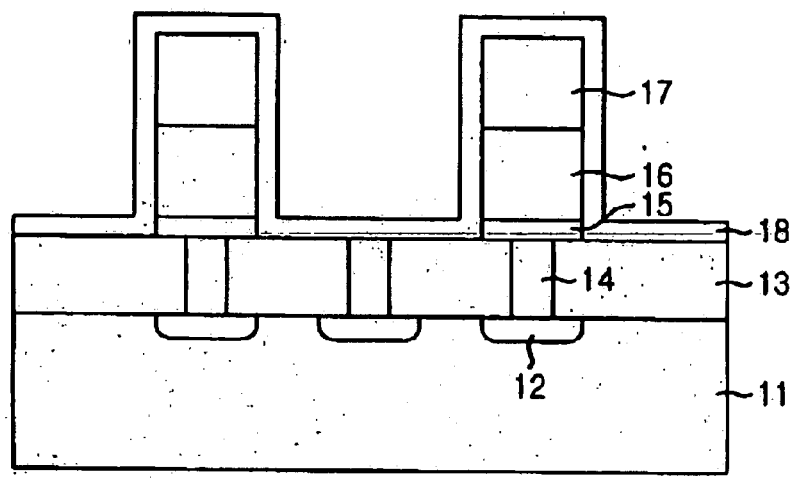
Figure 1D:
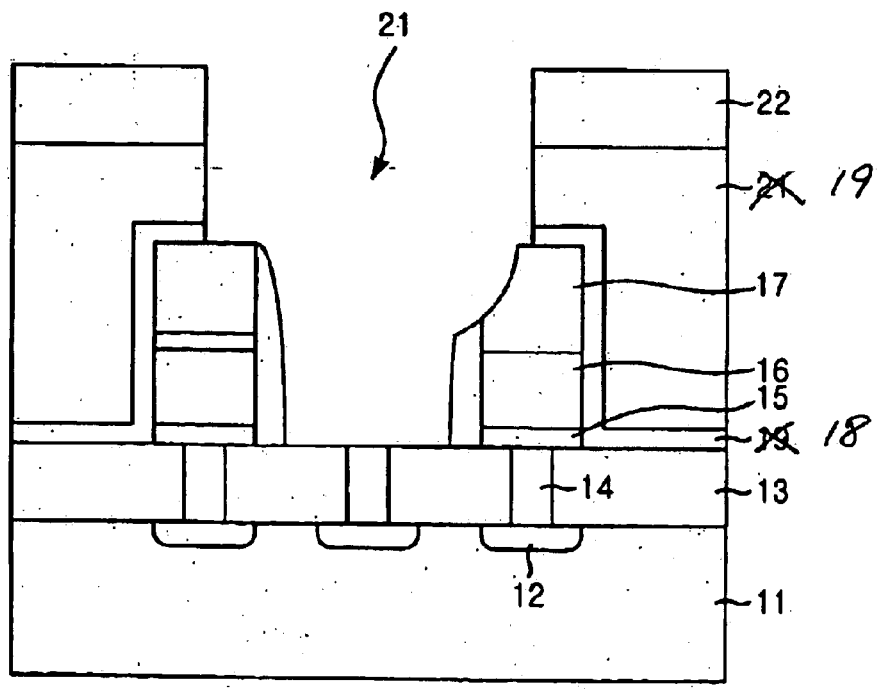
Figure 2A:
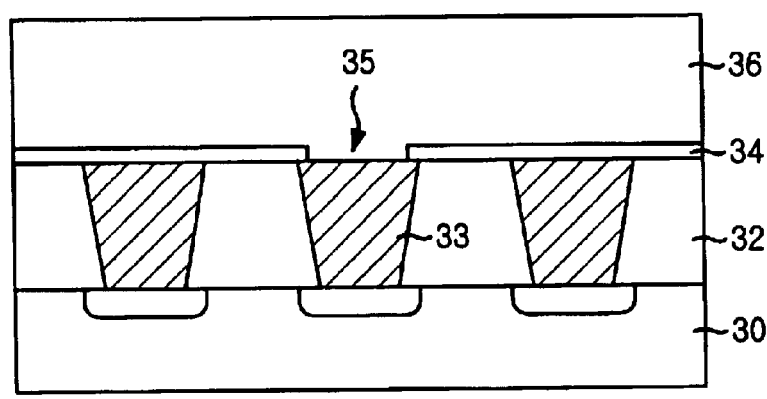
FIGS. 2A to 2D are cross-sectional views showing a process for forming a storage node contact hole in accordance with a first preferred embodiment of the present invention.
Figure 2B:
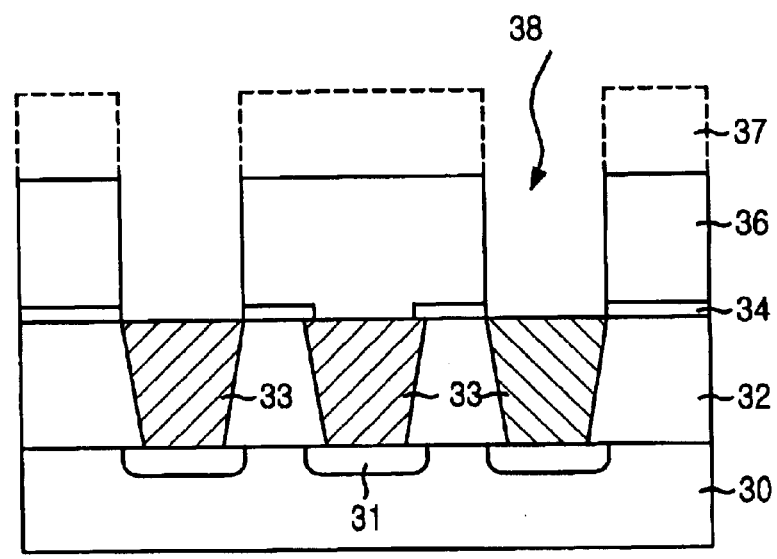

Referring to FIG. 2A, a first inter-layer insulation layer 32 is deposited on a substrate 30 providing various elements including a word line (not shown), impurity contact regions 31 and so forth. The first inter-layer insulation layer 32 is selectively etched to form a contact hole exposing the impurity contact region 31.

Next, a plurality of plugs 33 for bit line or storage node contacts are formed. At this time, each plug 33 buries the contact hole and is contacted to the exposed impurity contact region 31. Herein, for the bit line or the storage node contacts, the plug 33 includes a typical landing plug contact (LPC) contacted to the impurity contact region 31.

In addition, the plug 33 is made of, e.g., polysilicon. Recently, a multi-layer structure including a tungsten layer and a barrier metal layer such as Ti/TiN used in the typical diffusion barrier layer can be used for the plug 33 instead of the polysilicon.

Next, an etch stop layer 34 is deposited on the above entire structure including the plug 33. A surface of the plug 33 for only the storage node contact is exposed among the plurality of the plugs 33. This exposed surface of the plug 33 for the storage node contact is denoted as the reference numeral 35. Also, the etch stop layer 34 preferably uses nitride based materials including silicon nitride or silicon oxynitride.

A second inter-layer insulation layer 36 is deposited on the above structure including the exposed plug 33. Herein, the second inter-layer insulation layer 36 is called as a bit line insulation layer. After the deposition, an upper part of the second inter-layer insulation layer 36 is planarized. The second inter-layer insulation layer 36 uses high density plasma (HDP) oxide, boron phosphorus silicate glass (BPSG), phosphorus silicate glass (PSG), boron silicate glass (BSG), spin-on-dopant (SOD) or advanced planarization layer (APL).

Meanwhile, the deposition of the second inter-layer insulation layer 36 prior to forming a bit line prevents a generation of void. The void is generated when the second inter-layer insulation 36 is deposited after the bit line formation.

On top of the second inter-layer insulation layer 36, a photoresist pattern 37 for forming trenches 38 exposing a group of the plugs 33 for bit line contacts is formed. Then, the second inter-layer insulation layer 36 and the etch stop layer 34 are selectively etched with use of the photoresist pattern 37 so that the trenches 38 exposing the group of the plugs 33 for the bit line contacts are formed.

Afterwards, a photoresist strip process is performed to remove the photoresist pattern 37. In the meantime, it is possible to form an additional anti-reflection layer on between the photoresist pattern 37 and the second inter-layer insulation layer 36. However, such an anti-reflection layer is not illustrated.

Figure 2C:
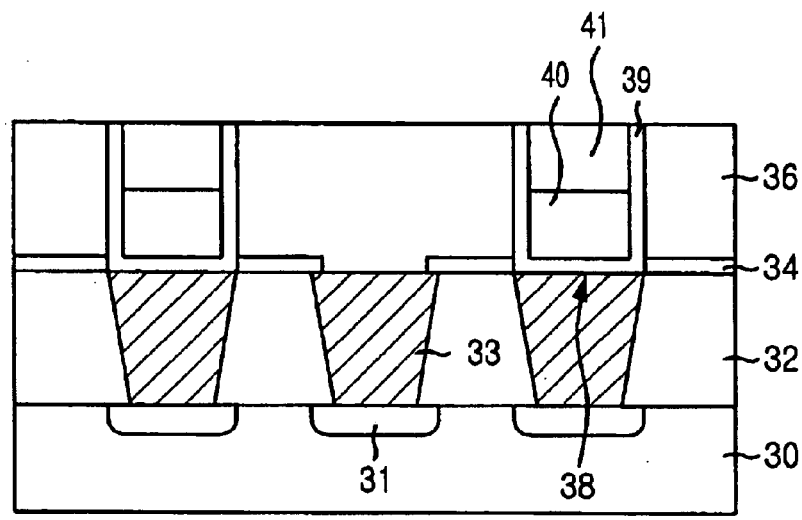

Referring to FIG. 2C, a diffusion barrier layer 39 is deposited along the trench 38 in such a manner to encompass lateral walls and a bottom side of the trench 38. Preferably, the diffusion barrier layer 39 has the typical structure of Ti/TiN or Ta/TaN in order to suppress a source gas used for depositing a bit line metal layer 40 from reacting with the plug 33 and the impurity contact region 31.

The bit line metal layer 40 is then formed on the diffusion barrier layer 39 by using metal such as polysilicon, tungsten and so forth or metal alloys such as tungsten nitride, tungsten silicide and so forth.

A plasma enhanced chemical vapor deposition (PECVD) technique or a low pressure chemical vapor deposition (LPCVD) technique is used to deposit a bit line hard mask insulation layer 41 on the bit line metal layer 40. It is preferable to use nitride-based materials for the bit line hard mask insulation layer 41 in order to prevent the bit line metal layer 40 from being attacked during an etch process for forming a storage node contact and to obtain an etch profile by having a different etch selectivity from an oxide-based inter-layer insulation layer 36.

Next, a chemical mechanical polishing (CMP) process is performed under a target of exposing the second inter-layer insulation layer 36 so to form a bit line having a damascene structure that the diffusion barrier layer 39, the bit line metal layer 40 and the bit line hard mask insulation layer 41 are buried into the trench 38. FIG. 2C represents a cross-sectional view of the above structure including the bit line with the damascene structure.

It is also possible to form additionally a buffer layer with use of undoped silicate glass (USG) in order to reduce stress possibly generated between the bit line metal layer 40 and the bit line hard mask insulation layer 41.

Figure 2D:
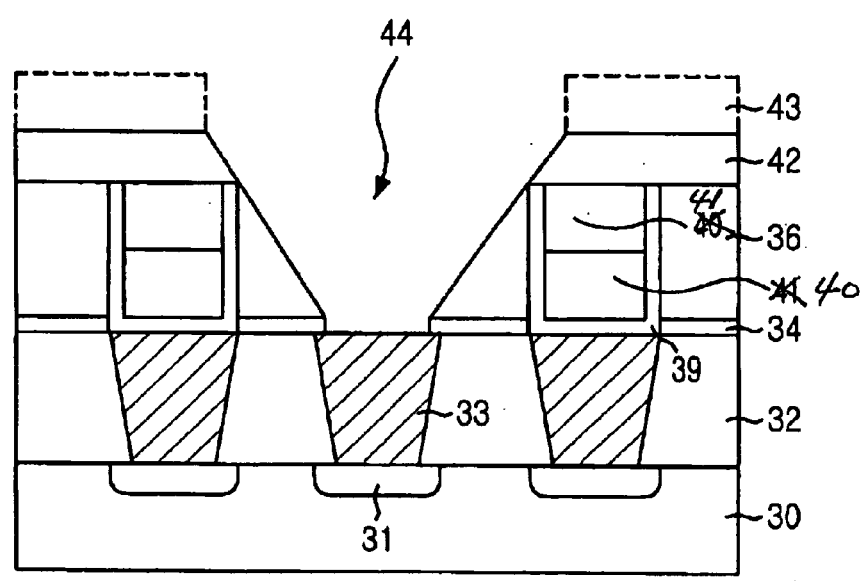

As shown in FIG. 2D, a third inter-layer insulation layer 42 is deposited on the bit line having the damascene structure, and a planarization process is performed thereafter. The third inter-layer insulation layer 42 uses BPSG, BSG, PSG, HDP oxide or APL.

Another photoresist pattern 43 for forming storage node contacts is formed on the third inter-layer insulation layer 42. Then, a self-align contact (SAC) process is performed. That is, the third inter-layer insulation layer 42 and the second inter-layer insulation layer 36 are sequentially etched by using the photoresist pattern 43 as an etch mask. From this SAC process, a storage node contact hole 44 exposing the surface of the plug 33 allocated between the bit lines is formed.

The above etch process is a dry-type etch process combined with a recipe for the SAC process. For this etch process, it is possible to use different types of etch gas. Such gas containing lots of carbons inducing polymers can be used as the etch gas so that the oxide-based second inter-layer insulation layer 36, the nitride-based etch stop layer 34 and the third inter-layer insulation layer 42 have a high etch selectivity. Examples of this etch gas are $C_3F_8$, $C_4F_8$, $C_5F_8$, $C_4F_6$ or $C_2F_4$. Such gas as $CHF_3$, $C_2HF_5$, $CH_2F_2$, $CH_3F$ or $H_2$ can be also used as the etch gas for providing a reliable etch process by enhancing an etch process margin. Also, such inert gas as He, Ne, Ar, Kr or Xe can be also used as the etch gas for improving an etch stop function by increasing a sputtering effect and plasma stability. It is also possible to use a gas obtained by combining the aforementioned etch gases with each other. It is further possible to add $C_xH_yF_z$, where x, y and z is equal to or greater than about 2, to the etch gas containing lots of carbons to secure a margin of the etch process.

Figure 3A:
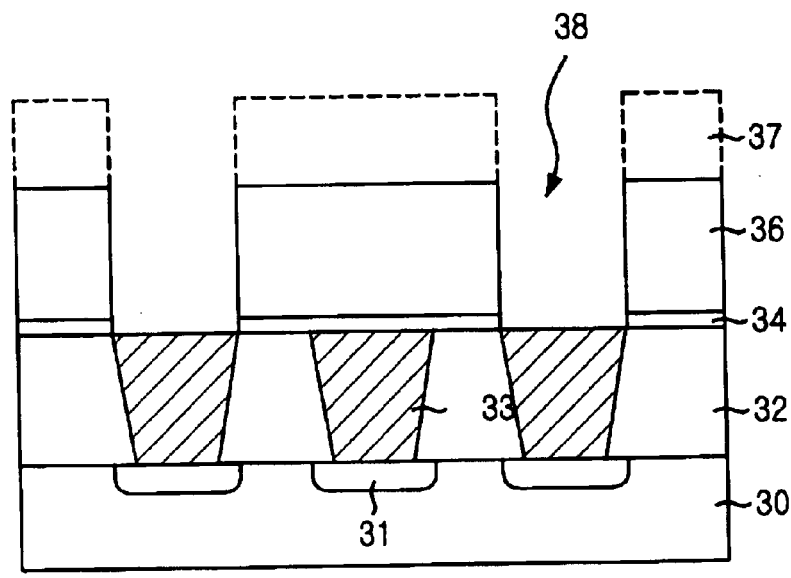
FIGS. 3A and 3B are cross-sectional views showing a process for forming a storage node contact hole in accordance with a second preferred embodiment of the present invention.
Figure 3B:
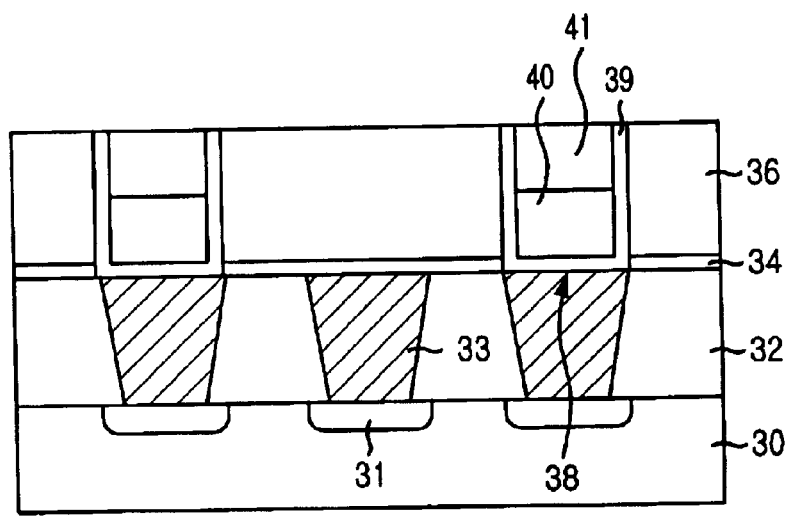

FIGS. 3A and 3B are cross-sectional views showing a process for forming a storage node contact hole in accordance with a second preferred embodiment of the present invention. Also, the same constitution elements used in FIGS. 2A to 2D are denoted with the same reference numerals used in the second preferred embodiments.

A first inter-layer insulation layer 32 is deposited on a substrate 30 providing various elements such as a word line (not shown), impurity contact regions 31 and so forth. The first inter-layer insulation layer 32 is called as a word line insulation layer. Then, a contact hole is formed by selectively etching the first inter-layer insulation layer 32.

Next, a plurality of plugs 33 for storage node contacts or bit line contacts are formed. At this time, each plug 33 buries the contact hole and is contacted to the impurity contact region 31. Herein, for the bit line or the storage node contacts, the plug 33 includes a typical landing plug contact (LPC) contacted to the impurity adhesion region 31. Also, the plug 33 is made of polysilicon. Recently, a multi-layer structure including stacked layers of a barrier metal layer such as Ti/TiN and a tungsten layer can be also used.

Afterwards, an etch stop layer 34 is formed on the above structure including the plug 33. It is preferable to use nitride-based materials such as silicon nitride or silicon oxynitride for the etch stop layer 34.

Meanwhile, a partial portion of the etch stop layer 34 is etched so that a group of the plugs 33 for the storage node contact is exposed. However, explanations on the etch process for the etch stop layer 34 is omitted.

A second inter-layer insulation layer 36 is deposited on an entire surface of the above structure including the etch stop layer 34, and an upper part of the second inter-layer insulation layer 36 is planarized thereafter. The second inter-layer insulation layer 36 is called as a bit line insulation layer. Additionally, the second inter-layer insulation layer uses HDP oxide, BPSG, PSG, BSG, SOD or APL. As a result, the second inter-layer insulation layer 36 deposition prior to forming a bit line can prevent a generation of void. The void is generated when the second inter-layer insulation layer 36 is deposited after the bit line formation.

On top of the second inter-layer insulation layer 36, a photoresist pattern 37 for forming trenches 38 exposing a group of the plugs 33 for bit line contacts is formed. Then, the second inter-layer insulation layer 36 and the etch stop layer 34 are selectively etched with use of the photoresist pattern 37 so that the trenches 38 exposing the group of the plugs 33 for the bit line contacts are formed.

Afterwards, a photoresist strip process is performed to remove the photoresist pattern 37. In the mean time, it is possible to form an additional anti-reflection layer on between the photoresist pattern 37 and the second inter-layer insulation layer 36. However, such an anti-reflection layer is not illustrated.

Referring to FIG. 3B, a diffusion barrier layer 39 is deposited along the trench 38 in such a manner to encompass lateral walls and a bottom side of the trench 38. The diffusion barrier layer 39 has the typical structure of Ti/TiN or Ta/TaN in order to suppress a source gas used for depositing a bit line metal layer 40 from reacting with the plug 33 and the impurity contact region 31.

The bit line metal layer 40 is then formed on the diffusion barrier layer 39 by using metal such as polysilicon, tungsten and so forth or metal alloys such as tungsten nitride, tungsten silicide and so forth.

A PECVD technique or a LPCVD technique is used to deposit a bit line hard mask insulation layer 41 on the bit line metal layer 40. It is preferable to use nitride-based materials for the bit line hard mask insulation layer 41 in order to prevent the bit line metal layer 40 from being attacked during an etch process for forming a storage node contact and to obtain an etch profile by having a different etch selectivity from an oxide-based inter-layer insulation layer 36.

Next, a chemical mechanical polishing (CMP) process is performed under a target of exposing the second inter-layer insulation layer 36 so to form a bit line having a damascene structure that the diffusion barrier layer 39, the bit line metal layer 40 and the bit line hard mask insulation layer 41 are buried into the trench 38. FIG. 3B represents a cross-sectional view of the above structure including the bit line with the damascene structure.

It is also possible to form additionally a buffer layer with use of USG in order to reduce stress possibly generated between the bit line metal layer 40 and the bit line hard mask insulation layer 41.

Such processes described in FIG. 2D in the above are performed. However, at this time, a portion of the etch stop layer 34 corresponding to the exposed plug 33 for the storage node contact is removed.

Since the bit line is formed by using the damascene process, the void is not generated at the bit line insulation layer. Therefore, it is possible to prevent the bit line from being attacked during the SAC process. Also, the bit line formation with use of the damascene process makes it possible that the bit line insulation layer is not exposed to the upper part of the bit line. Because of this non-exposure of the bit line insulation layer, the etch target is decreased during the etch process for forming the storage node contact hole. Accordingly, it is possible to improve the etch profile. Due to these effects, yields of the semiconductor device can be ultimately enhanced.

In addition to the storage node contact plug formation, the present invention can be applied to other semiconductor device fabrication processes for which the SAC process is employed. A process for opening an active region between gate electrodes is one example.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:

forming a bit line insulation layer on a substrate structure having a plurality of plugs;

forming a group of trenches exposing a group pf the plugs by etching the bit line insulation layer;

burying each trench by a conductive material to form a bit line electrically connected to the exposed plug;

isolating the bit line by performing a chemical mechanical polishing process until the bit line insulation layer is exposed;

forming an inter-layer insulation layer on the above structure including the bit line, wherein the bit line includes a diffusion barrier layer formed along the trench, a metal layer formed on the diffusion barrier layer and a hard mask insulation layer formed on the metal layer; and etching selectively the inter-layer insulation layer and the bit line insulation layer to form storage node contact holes exposing another group of the plugs.

2. The method as recited in claim 1, further comprising the step of forming an etch stop layer on an entire surface of the substrate including the plurality of he plugs prior to forming the bit line insulation layer.

3. The method as recited in claim 2, further comprising the step of etching selectively the etch stop layer to expose at least one group of the plugs for the storage node contacts, this step being performed after the step of forming the etch stop layer.

4. The method as recited in claim 2, wherein at the step of forming the storage node contact hole, the etch stop layer on the group of plugs for the storage node contacts is etched.

5. The method as recited in claim 4, wherein the etch stop layer is a nitride-based layer.

6. The method as recited in claim 1, wherein the bit line insulation layer uses HDP oxide, BPSG, PSG, BSG, SOD or APL.

7. The method as recited in claim 1, wherein the etch process is a dry-type etch process combined with a recipe for a SAC process.

8. The method as recited in claim 7, wherein the etch process employs an etch gas selected from a group consisting of $C_4F_6$, $C_4F_8$, $C_3F_8$, $C_5F_8$ and $C_3F_6$ for allowing the bit line insulation layer, the inter-layer insulation layer and the etch stop layer to have a high etch selectivity.

9. The method as recited in claim 7, wherein the etch process employs an etch gas selected from a group consisting of $CHF_3$, $C_2HF_5$, $CH_2F_2$, $CH_3F$, and $H_2$ for increasing an etch process margin for a reliable etch process.

10. The method as recited in claim 7, wherein the etch process employs an etch gas selected from a group consisting of He, Ne, Ar, Kr or Xe for improving an etch stop function by enhancing a sputtering effect and plasma stability.

11. A method for fabricating a semiconductor device, comprising the steps of:

providing a substrate having a plurality of plugs;

forming an etch stop layer on the substrate;

forming a bit line insulation layer on the etch stop layer;

forming a group of trenches exposing a group of the plugs by etching the bit line insulation layer;

burying each trench by a conductive material to form a bit line electrically connected to the exposed plug;

isolating the bit line by performing a chemical mechanical polishing process until the bit line insulation layer is exposed;

forming an inter-layer insulation layer on the above structure including the bit line, wherein the bit line includes a diffusion barrier layer formed along the trench, a metal layer formed on the diffusion barrier layer and a hard mask insulation layer formed on the metal layer; and etching selectively the inter-layer insulation layer and the bit line insulation layer to form storage node contact holes exposing another group of the plugs.

12. The method as recited in claim 11, further comprising the step of etching selectively the etch stop layer to expose at least one group of the plugs for the storage node contacts before forming the bit line insulation layer.

13. The method as recited in claim 12, wherein the etch stop layer is a nitride-based layer.

* * * * *